United States Patent [19]

Fayling

[11] 4,103,340
[45] Jul. 25, 1978

[54] ELECTROMAGNETIC SENSOR AND MEMORY DEVICE

[75] Inventor: Richard E. Fayling, White Bear Lake, Minn.

[73] Assignee: Minnesota Mining and Manufacturing Company, St. Paul, Minn.

[21] Appl. No.: 643,014

[22] Filed: Dec. 22, 1975

Related U.S. Application Data

[62] Division of Ser. No. 451,994, Mar. 18, 1975.

[51] Int. Cl.² ............................................. G11C 17/02
[52] U.S. Cl. ..................................................... 365/97
[58] Field of Search .................. 340/174 PM, 174 SP; 365/97; 235/61.11 D

[56] References Cited

U.S. PATENT DOCUMENTS

| | | | |
|---|---|---|---|
| 3,080,549 | 3/1963 | Rubens | 340/174 R |
| 3,375,503 | 3/1968 | Bertelsen | 340/174 TF |
| 3,566,373 | 2/1971 | Shackell | 340/174 SP |

FOREIGN PATENT DOCUMENTS 965,596   8/1964   United Kingdom ......... 340/174 PM

*Primary Examiner*—James W. Moffitt
*Attorney, Agent, or Firm*—Cruzan Alexander; Donald M. Sell; William B. Barte

[57] ABSTRACT

An electromagnetic sensor and memory device for employment with a reader for magnetically encoded cards has a plurality of bit indicators that detect magnetized data bits in such cards. Each bit indicator is formed from a ferromagnetic core magnetizable to either of two opposite stable magnetized states that switch from one stable state to the other upon application of an appropriate magnetizing field. A control element disposed through the core serves to provide the magnetizing field for switching the stable state of the core and also serves as a sensing means for detecting each switch between stable states. In a modified embodiment, bias magnetizing field sources are employed with the bit indicators to provide a variety of bit sensing operations.

4 Claims, 12 Drawing Figures

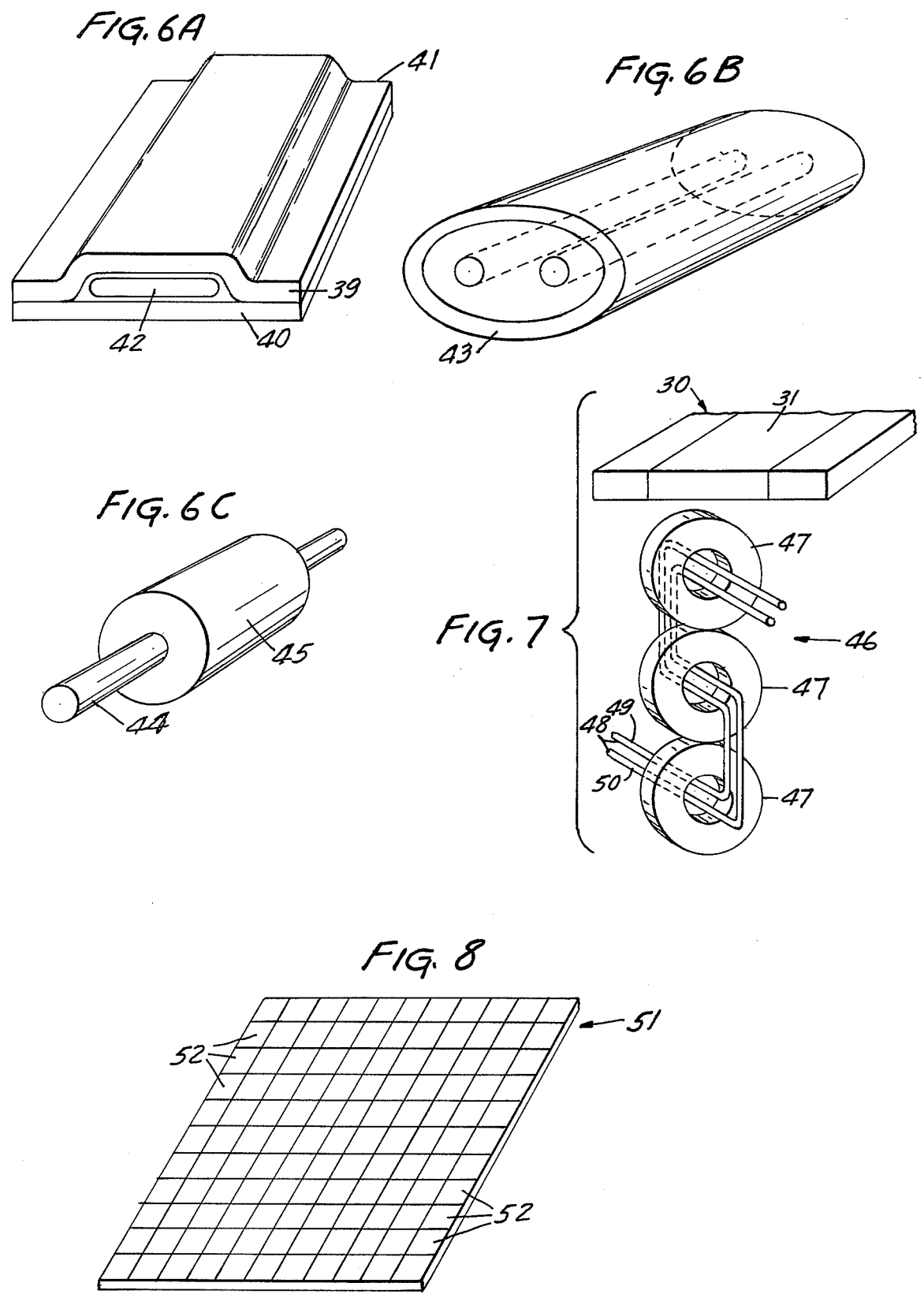

ELECTROMAGNETIC SENSOR AND MEMORY DEVICE

This is a division of application Ser. No. 451,994 filed Mar. 18, 1974.

BACKGROUND OF THE INVENTION

1. Field of the Invention

The present invention relates in general to electromagnetic reading of magnetically encoded cards, and more specifically to a sensor for detecting magnetized bits in regions in such cards.

2. Description of the Prior Art

Various readers and sensing devices for detecting magnetized bits in regions in magnetically encoded cards are known in the art as evidenced by U.S. Pat. Nos. 3,521,258 to Hurt, and to Rogers et al, 3,717,749.

The Hurt patent discloses an electromagnetic sensor for detecting magnetized bits, which sensor has two pairs of drive and sense windings. When the drive windings are pulsed with a current, a voltage is induced in each of the sense windings. The induced voltages oppose and cancel one another when the sensor is not in a close proximity to a magnetized bit. In contrast, when a magnetized bit is adjacent the sensor one pair of the drive and sense windings is positioned to be in a closer position to the bit than the other pair of windings so that the voltage induction between such one pair of windings is varied from a normal level. Such voltage variation is sufficiently great that cancellation of the voltages in the sense windings does not occur and thereby the presence of a magnetized bit is indicated.

In the Rogers et al patent, an electromagnetic sensor is disclosed that is formed of a high permeability core within a coil. Positioning a magnetized bit near one end of the core magnetizes the core to near saturation, and a current pulse through the coil at that time either fully saturates the core or drives the core away from saturation depending on the direction of the magnetizing force of the bit. The polarity of the bit is thereafter indicated by the difference in the pulse decay time resulting from increased or decreased coil inductance.

Although the above discussed sensors of Hurt and Rogers et al appear to provide satisfactory sensing of bits 0.125 inch (3 mm) or larger in diameter, there is an increasing need for sensors that will detect bits of much smaller diameters in order that considerably more information may be encoded in a credit card or the like. Furthermore, as more and more information is encoded in a card the importance of reliability of operation and simplicity of construction of a sensor for reading encoded cards is likewise increased.

SUMMARY OF THE INVENTION

The present invention provides an improved electromagnetic sensor for detecting magnetized data bits in an adjacent magnetically encoded card, i.e., a card that has been subjected to localized magnetic fields to provide the magnetized data bits at selected localized regions of the card, and includes a plurality of bit indicators that are each formed of a ferromagnetic core magnetizable to at least two equal and opposite magnetically stable states, and a control means disposed through said core. Forming the control means are a drive means that provides a magnetic field for switching the magnetization of each core from one stable state to the other and a sense means in which an electrical signal is induced during each stable state transition.

In a preferred embodiment, the indicator cores are substantially toroidal in shape and the control means is formed of a pair of electrical conductors, one of which serves as the drive means and the other serves as the sense means. When an electrical pulse is applied to the drive means of the indicators, a first stable remanent magnetized state is induced in the indicator cores. The squareness ratio of the cores is high and such magnetized state remains virtually unchanged until a second electrical pulse opposite to the first pulse is applied to the drive means for producing a transition of the magnetization in the cores from the first state to a second remanent state.

The transition between stable remanent states occurs abruptly and induces a sharp electrical signal pulse in the sense means, which signal can be readily detected by common electronic circuitry. However, when a magnetized bit of a magnetically encoded card is within close proximity of the cores, the bit magnetic fields of the card induce the indicator cores into a nonremanent magnetized state that prevents the coils from switching between stable states. Thus, if electrical pulses for switching the magnetization of the cores from one stable state to the other stable state are applied to the drive means of the indicators, a transition of the magnetization of the cores does not occur. As a result, drive pulses only produce sensing pulses in the sense means when a core is not in the magnetic influence of a magnetized bit. Accordingly, the sensor of the present invention provides a readily discernible indication of the presence or absence of magnetized bits.

In a modified embodiment the sensor includes a plurality of magnetic field sources, one such source near each bit indicator core to normally influence the cores with a magnetic field similar to that induced by the bit of a magnetically encoded card. The field sources, therefore, also prevent the indicator cores from switching between magnetized stable states. Thus, core stable state transitions do not occur unless the cores are near a magnetized bit that provides a magnetic field opposite in polarity and substantially equal to the field of the bias field sources so that there is a cancellation of the two fields. Upon such cancellation, drive pulses thereafter cause the stable state of the cores to switch and result in sensing indications in the sense means. Accordingly, this modified embodiment only provides readily detectable pulses when the cores of the sensor are in the magnetic influence of a specific type of encoded card bit, and such embodiment can be employed with a wide variety of magnetically encoded cards.

In addition to the above described sensing operations, the electromagnetic sensor of the present invention also provides a relatively simplistic and inexpensive means and method for storing the encoded data of a magnetically encoded card in memory until such time that the information can be processed.

The foregoing and other advantages of the present invention will appear from the following description. In the description reference is made to the accompanying drawings, which form a part hereof, and in which there is shown by way of illustration, and not of limitation, specific forms in which the invention may be embodied. Such embodiments do not represent the full scope of the invention, but rather the invention may be employed in a variety of embodiments, and reference is made to the claims herein for interpreting the breadth of the invention.

BRIEF DESCRIPTION OF THE DRAWINGS

FIG. 6A is an enlarged perspective view of a bit indicator that may be utilized in the sensor of FIG. 1 in substitution for the indicator of FIG. 3A;

FIG. 6B is an enlarged perspective view of another type of bit indicator construction that may be utilized in the sensor of FIG. 1;

FIG. 6C is an enlarged perspective view of yet another type of bit indicator that may be utilized in the sensor of FIG. 1;

FIG. 7 is an enlarged perspective view of a complex bit indicator that may be utilized in the sensor of FIG. 1; and FIG. 8 is a perspective view of a magnetically encoded card having a plurality of magnetized regions.

DESCRIPTION OF THE PREFERRED EMBODIMENTS

Figure 1:
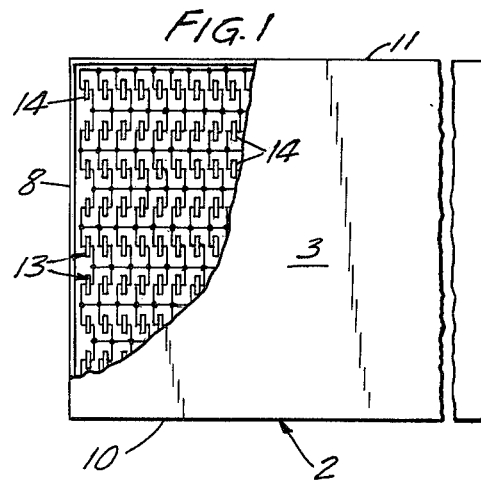
FIG. 1 is a plan view of an electromagnetic sensor of the present invention with portions cut away to show interior construction.
Figure 2:
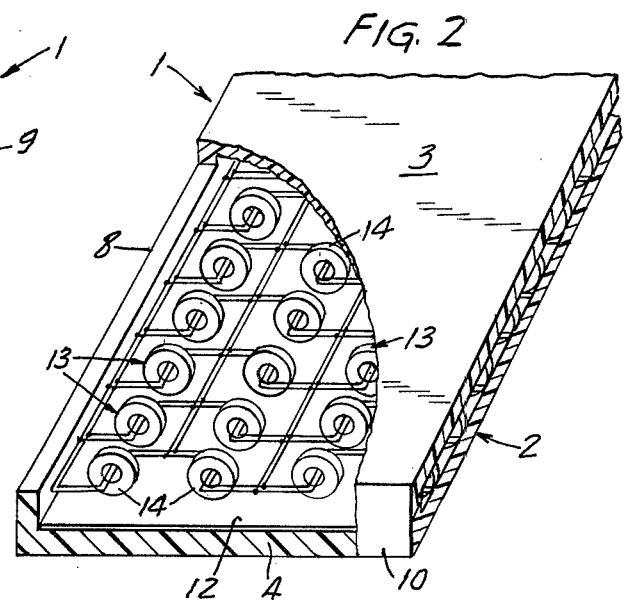
FIG. 2 is an enlarged fragmentary perspective view of the sensor of FIG. 1 with portions cut away to show interior construction.

Referring now to the drawings and with reference first to FIGS. 1 and 2, an electromagnetic sensor 1 is shown that represents a preferred embodiment of the present invention. The sensor 1 is particularly advantageous for employment with a card reader that detects the presence of data bits located in regions of a magnetically encoded card. Such bits may each be in the form of a single magnetized section, or of a pair of magnetized sections interfaced together at a common boundary as described in my U.S. Patent issued Nov. 12, 1970 and having U.S. Pat. No. 3,714,664. The sensor 1 is shown as having a self contained housing 2, but for practical considerations it may be desirable to build the sensor 1 as an integral part of a card reader with which it is employed.

The sensor housing 2 has a relatively thin rectangular cnfiguration and is formed of a top wall 3, a bottom wall 4, sidewalls 8 and 9, and end walls 10 and 11. A backing card 12 is positioned in the housing 2 and is parallel to the top wall 3. Mounted on the card 12 in close proximity to the top wall 3 is a planar array of a plurality of minute bit indicators 13 arranged in a number of rows and columns, but such arrangement is not essential to the present invention. Instead, the indicators 13 may be positioned in various arrangements to conform with the location of magnetized bits in the encoded cards that the sensor 1 may be utilized for reading.

Figure 3A:
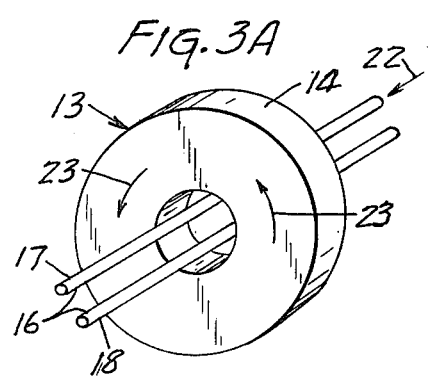
FIG. 3A is an enlarged perspective view of a bit indicator included in the sensor of FIG. 1 and magnetized in a first stable remanent state.

As indicated in FIG. 3A, the bit indicators 13 each include a toroidal, ferrite core 14 through which a control means 16 is disposed. A pair of electrical conductors 17 and 18 form the control means 16 and serve respectively as a drive means and a sense means. Rather than using two conductors in the control means it may be desirable to use a single conductor that acts as both the drive and sense means. It would also be possible to employ more than one of the conductors 17 to form the drive means such as presently used in addressing computer memories. The core 14 is preferably formed from a ferromagnetic, ceramic material such as magnesium-manganese ferrites or other spinel ferrites as described in Smit, *Magnetic Properties of Materials*, 222–231 (1971) and has a rectangular hysteresis loop 19, of the type shown in the graph of FIG. 3B, with two remanent magnetized stable states 20 and 21. The term "ferromagnetic" is used herein to include both ferromagnetic and ferrimagnetic.

Figure 3B:
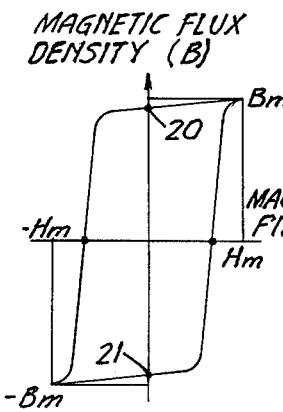
FIG. 3B is a graph of a hysteresis loop indicating the magnetic characteristics of the bit indicator of FIG. 3A.

Referring now to FIG. 3B in conjunction with FIG. 3A, directing a d-c pulse, represented by the arrow 22, through the drive conductor 17 results in a magnetic field $H_m$ of the form of closed loop concentric lines that induce a similarly configured stable remanent magnetized state that circles the conductor 17. The magnetic flux 23 resulting from this magnetization state is substantially confined in the core 14. Upon termination of the pulse 22 through the drive conductor 17, the magnetic field $H_m$ relaxes and the magnetic flux density decreases a small amount to the stable state 20.

Figure 3C:
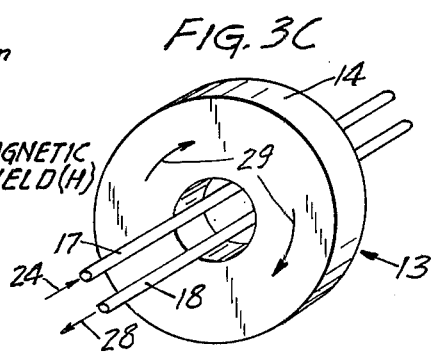
FIG. 3C is an enlarged perspective view of the bit indicator of FIG. 3A magnetized in a second stable remanent state.

The squareness ratio of the core 14 is high in order that the magnetization of the core 14 remains virtually unchanged from the stable state 20 even in the presence of a reverse magnetizing force approaching the coercive force. As indicated by FIGS. 3B and 3C, however, application of a second d-c pulse 24 in the drive conductor 17 (such pulse being equal in magnitude but opposite in direction to the pulse 22) produces a reverse magnetizing field $-H_m$ in the direction 29 that abruptly reverses the magnetization state of the core 14 in the same direction 29 to result in a magnetic flux density $-B_m$, also in the direction 29.

The reverse magnetic field $-H_m$ falls to zero at the termination of the current pulse 24 and the negative magnetic flux density $-B_m$ decreases slightly to the stable remanent state 21. A second d-c pulse 22 will thereafter cause another abrupt reversal in the magnetization of the core 14 and return it back to the magnetic flux density $B_m$. Thus, by directing d-c pulses through the drive conductor 17 — first in one direction and then in the opposite direction — the magnetized stable states of the core 14 are abruptly reversed. Each abrupt reversal of the magnetic flux in the core 14 induces an easily detectable short duration discrete output pulse represented in FIG. 3C by the arrow 28 in the sense conductor 18, and standard electronic circuitry (not shown) may be employed to receive the pulses 28 for detecting the flux reversals that occur. In contrast to using d-c pulses in the drive conductor 17, a-c pulses may be applied to the drive conductor 17 to produce a series of abrupt reversals between the two stable magnetized states 20 and 21.

Figure 4:
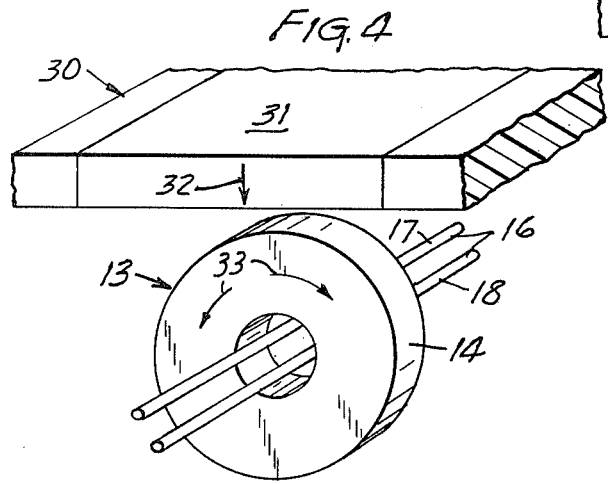
FIG. 4 is an enlarged perspective view of the bit indicator of FIG. 3A adjacent a magnetized bit of a magnetically encoded card.

The pulses 28 that are induced in the sense conductor 18 are utilized in the present invention to indicate that the bit indicator 13 of FIG. 3A is not in close proximity to a magnetized bit of a magnetically encoded card. Referring now to FIG. 4, one of the bit indicators 13 is shown adjacent a portion of a magnetically encoded card 30 having a magnetized encoded bit 31 of the type normally employed to form a magnetized region of an encoded card. The bit 31 may be magnetized such that the direction of its internal magnetic field will be either perpendicular to the planar surface of the card or parallel thereto, but for purposes of clarity the following description of the operation of the present invention is made assuming a perpendicular internal magnetic field, indicated in direction by the arrow 32, is present.

Due to the close proximity of the indicator 13 to the magnetized bit 31, the magnetic field of the bit 31 induces magnetization of the indicator core 14 with what is substantially a unidirectional field resulting in magnetization as represented by the arrows 33. The bit field is stronger in magnitude than that induced by drive pulses in the conductor 17. Accordingly, the bit field dominates in determining the resulting magnetized state of the core 14. Only a relatively weak magnetic field is required to induce the stable states 20 or 21 in the core 14 in the absence of a bit field. A typical 0.125 inch (3 mm) magnetic bit that is normally employed in present magnetically encoded cards produces an external magnetic density of 300 oersteds, whereas the external magnetic field necessary to induce the stable remanent states 20 or 21 in the absence of a bit field is developed as a result of a one amp current pulse that typically produces peak fields of approximately 3-15 oersteds at the core 14.

The magnetic field associated with the bit 31 locks the core 14 in a nonremanent magnetized third state and prevents flux reversal from the stable state 20 to the stable state 21, or vice versa regardless of the number of drive pulses in the drive conductor 17. This means that the magnetized bits of a magnetically encoded card placed on the top wall 3 of the sensor 1 can be readily ascertained by interrogating each indicator 13 with an a-c drive pulse or no more than two oppositely directed d-c drive pulses in their associated drive conductors 17. If one of the indicators is not adjacent a magnetized bit 31, it provides sensing pulses in its respective sensing conductor 18 in response to the drive pulses, but if it is near a magnetized bit 31 it will be held in a magnetically locked up condition wherein no signal pulses are induced in its sense conductor 18. Thus, the present invention provides a magnetized bit sensor with an operation that furnishes two clearly discernible conditions to indicate the presence or absence of magnetized bits of an encoded card. As a result, the sensing operation of the present invention is highly reliable, but yet involves structure that is relatively simplistic and inexpensive.

Figure 5:
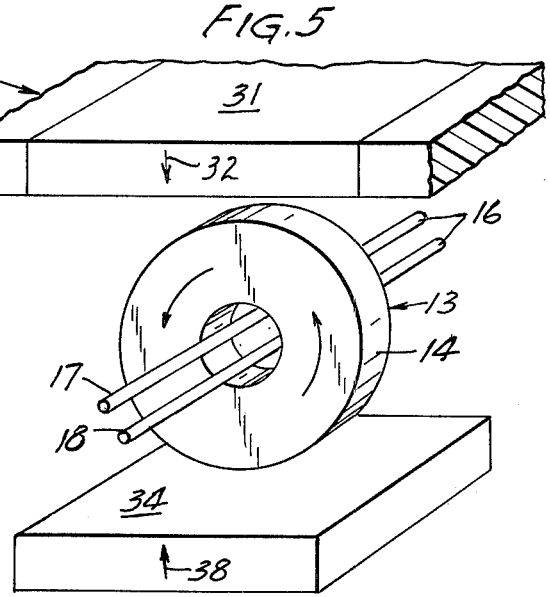
FIG. 5 is an enlarged perspective view of the bit indicator of FIG. 3A interposed between a magnetic field source and a magnetized bit of a magnetically encoded card.

Instead of indicating the absence of a magnetized bit with a sensing pulse, as described above, the sensor 1 may be modified to include a plurality of bias magnetic field sources 34 (one of which is shown in FIG. 5) that are disposed in the sensor 1 so that one field source 34 is positioned immediately beneath each indicator 13. The field sources 34 can be provided by using permanent magnets or current carrying conductors that may be adapted to change bias field direction or magnitude when necessary to sense bits of different polarity or size. The purpose of the sources 34 is to bias the cores 14 with a sufficiently strong unidirectional field, indicated by the arrows 38 in FIG. 5, so that the cores 14 are normally in a nonremanent or unstable magnetized third state that inhibits magnetization in the cores 14 from existing in the stable state 20 or 21, or switching therebetween.

The strength of the magnetic fields of the field sources 34 should be carefully selected in order that they approximately equal the magnitude of the magnetic fields of the bits 31 in the magnetically encoded cards 30 with which the sensor 1 is to be employed. As indicated by FIG. 5, the magnetic fields of the bits 31 and the field sources 34 are opposite in direction and serve to cancel one another. Upon such field cancellation, appropriate electrical pulses in the drive conductor 17 of the indicator 13 thereafter induce one of the magnetized stable states 20 or 21 and subsequent transitions therebetween in the core 14. Thus, with the addition of the field sources 34 the bit indicators 13 signal the presence of an encoded bit by induced electrical pulses in the sense conductor 18.

Although the use of the field sources 34 allows the sensor 1 to provide electrical sense pulses in the conductor 18 only when detecting encoded bits 31 of one type of magnetic polarity, the bias field provided by the field sources 34 may be reversed to detect bits of opposite polarities and, thus, the use of the field sources 34 is highly advantageous in the present invention. Furthermore, the sources 34 permit the indicators 13 to operate within a range of magnetic fields that may be designed to allow normal variations in bit size, to permit the sensing of encoded cards with unmagnetized or oppositely magnetized background areas, and also to provide a means for ignoring bits 31 of the wrong size and polarity in an encoded card where it is desirable to conceal the encoded data.

In addition to the use of the field sources 34 the sensor 1 may be modified by employing other types of bit indicators as an alternative to the above construction of the indicators 13. As shown in FIG. 6A bit indicators may be formed with two relatively thin layers 39 and 40 of the ferromagnetic film employed as a core 41 to encircle a control means 42, or the bit indicators may be formed with a magnetic foil core 43, as shown in FIG. 6B. A third form of bit indicators (shown in FIG. 6C) may include a control means 44 that is plated with a ferromagnetic core material 45.

In some instances, it may be desirable to have larger output sensing pulses in the sense conductors 18 or a greater sensitivity to small bit fields than provided by the use of a bit indicator 13 with a single core 14 for each magnetized bit of an encoded card. Such increased performance may be achieved through the use of a complex bit indicator 46 shown in FIG. 7 together with the magnetically encoded card 30. The indicator 46 has three toroidal ceramic cores 47, but any number of cores 47 may be employed to obtain the desired output voltages or sensitivity. Similar to the bit indicators 13, the indicator 46 has a control means 48 formed of a drive conductor 49 and a sense conductor 50 that are directed through the cores 47 so that the pulses induced in the sense conductors 50 are additive. Greater sensitivity results from lengthening one direction of the core member because the permeability of the core member increases in that direction.

Thus, as shown and described, the present invention provides a sensor 1 that is simplistic in construction but yet provides an improved capability for detecting magnetic bits in magnetically encoded cards. In the above described embodiment, the sensor 1 is adapted to provide an indication of the presence of a magnetic bit without regard to holding such data in memory. However, the sensor 1 may also be employed as a programmable memory sensor that records in memory the particular data obtained from a magnetically encoded card and stores such data until processing of it can begin. Such recording in memory is produced by the sensor 1 as described following below.

Referring again to FIGS. 2 and 3A, each of the drive conductors 17 of the bit indicators 13 is pulsed with a sufficient d-c pulse to induce magnetization of their respective cores 14 in the first magnetized stable state 20. A magnetically encoded card 51, shown in FIG. 8, is then positioned on the top wall 3 of the sensor housing 2 to be in a close proximity to the planar array of the indicators 13. The card 51 is composed of a plurality of bit regions 52 equal to the number of bit indicators 13 in the sensor 1. Each bit region 52 is aligned directly above one of the indicators 13 and may or may not include a magnetized data bit.

Certain of the bit locations 51 are magnetized to represent one type of digital information such as a "1", and the remaining bit locations 52 are left unmagnetized to represent a "0". With the card 51 positioned on the housing top wall 3 of the sensor 1, the field of each magnetized bit location magnetically induces the core 14 of its corresponding bit indicator 13 in a nonremanent third magnetized state, such as indicated in FIG. 4. During the time the card is retained in close proximity to the indicator 13, subthreshold electrical pulses that tend to induce the magnetized stable state 21 in the cores 14 are supplied to all the drive conductors 17 and persist until after removal of the card 51 from the sensor 1. Such pulses are subthreshold pulses in that they are not sufficient by themselves to produce a reversal of the magnetized stable states of the cores 14 from the remanent state 20 to the state 21. Nevertheless, when the card 51 is removed from the sensor 1, the persistent subthreshold pulses provide a sufficient magnetic field to induce the cores 14 that are in the third nonremanent magnetized state to the stable state 21 because less energy is required to induce the stable state 21 in the cores 14 as the nonremanent state is relaxed than is required to switch the cores 14 from the stable state 20 to the stable state 21. Accordingly, the persistent subthreshold pulses do not effect switching in the cores 14 that were not induced with the nonremanent field. In this way, an information pattern is established in the sensor 1 and such information may be later processed. Therefore, not only does the present invention provide an improved magnetic bit sensing operation but also provides memory capabilities that make the present invention a versatile dual function sensor.

What is claimed is:

1. An electromagnetic sensor system for detecting data magnetically encoded in a document, said system comprising:
    a housing with at least one planar surface area;
    a two dimensional planar array of bit indicators disposed in said housing in a parallel relationship to said surface area, which bit indicators each include:
        at least one ferromagnetic core that is magnetizable to one of two alternate stable remanent magnetized states; and
        a control member centrally disposed through said core and including drive means that provides a magnetic field for switching the magnetization of said ferromagnetic core from one stable remanent state to the other and also including sense means in which an electrical signal is induced during each stable state transition;
    a plurality of magnetized bias field sources, each field source being associated with one of said cores and having a magnetic field to magnetize said associated core in a magnetized state that prevents the inducement of the stable remanent magnetized states and transitions therebetween; and
    a magnetically encoded document disposed in surface-to-surface contact with the planar surface of said housing and containing data represented by a plurality of magnetic data bits some of which have a magnetic field substantially opposite in magnitude and direction to that of each of said bias field sources, said data bits located in various bit regions arranged in a two dimensional pattern that includes at least one bit region aligned with each of said bit indicators so that the magnetic fields of some of said data bits substantially cancel the magnetic fields of the bias field sources magnetizing the bit indicators aligned with the bit regions in which said data bits are located.

2. A sensor device as recited in claim 1 wherein said cores each comprises a substantially toroidal member having an open center through which said control means is disposed.

3. A sensor device as recited in claim 1 wherein said cores each comprise two layers of ferromagnetic film between which said control means is disposed.

4. A sensor device as recited in claim 1 wherein each of said cores comprises a ring of ferromagnetic foil.

* * * * *